United States Patent
Imai

(10) Patent No.: US 6,891,184 B2
(45) Date of Patent: May 10, 2005

(54) IMAGE RECORDING MEDIUM AND METHOD OF PRODUCING THE SAME

(75) Inventor: Shinji Imai, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 235 days.

(21) Appl. No.: 10/360,812

(22) Filed: Feb. 10, 2003

(65) Prior Publication Data

US 2003/0151010 A1 Aug. 14, 2003

(30) Foreign Application Priority Data

Feb. 8, 2002 (JP) ........................................ 2002-032067

(51) Int. Cl.$^7$ ............................ G01T 1/16; H01L 31/00
(52) U.S. Cl. ........................................ 250/591; 250/580
(58) Field of Search .................................... 250/591, 580, 250/214.1, 208.2, 370.01, 370.08, 370.09, 370.11; 257/53, 428, 431; 430/57.8, 58.1, 59.1

(56) References Cited

U.S. PATENT DOCUMENTS

| 4,535,468 | A | | 8/1985 | Kempter | |
|---|---|---|---|---|---|
| 6,114,804 | A | * | 9/2000 | Kawase et al. | 313/495 |
| 6,268,614 | B1 | | 7/2001 | Imai | |
| 6,495,817 | B1 | | 12/2002 | Sato et al. | |
| 6,559,451 | B1 | * | 5/2003 | Izumi et al. | 250/370.08 |
| 6,649,438 | B2 | * | 11/2003 | Izumi et al. | 438/30 |
| 6,787,983 | B2 | * | 9/2004 | Yamanobe et al. | 313/495 |

FOREIGN PATENT DOCUMENTS

JP          2000-16726          1/2000

* cited by examiner

Primary Examiner—Otilia Gabor
(74) Attorney, Agent, or Firm—Sughrue Mion, PLLC

(57) ABSTRACT

An image recording medium includes a first electrode layer permeable to a recording electromagnetic wave carrying thereon image information, a recording photoconductive layer which generates electric charges according to the image information upon exposure to the recording electromagnetic wave and stores the electric charges and a second electrode layer for reading the electric charges stored in the recording photoconductive layer, which are superposed one on another in this order. An anti-discharge member for preventing occurrence of an electric discharge on the periphery of the first electrode layer is provided only on the periphery of the first electrode layer.

7 Claims, 2 Drawing Sheets

IMAGE RECORDING MEDIUM AND METHOD OF PRODUCING THE SAME

BACKGROUND OF THE INVENTION

1. Field of the Invention

This invention relates to an image recording medium which stores electric charges as latent image charges which are generated by recording electromagnetic waves carrying image information and a method of producing the same.

2. Description of the Related Art

As an image recording medium which stores electric charges, as latent image charges, generated upon exposure to recording electromagnetic waves carrying image information, there has been known a radiation image recording medium comprising a photoconductive body such as a selenium plate sensitive to a radiation such as X-rays. The radiation image recording medium is used, for instance, in taking a diagnostic radiation image and is exposed to X-rays passing through an object. Upon exposure to X-rays carrying thereon radiation image information, each part of the radiation image recording medium stores an electric charge according to the amount of X-rays to which the part is exposed, whereby the radiation image recording medium stores, as an electrostatic latent radiation image, the radiation image information carried by the X-rays. The radiation image information can be read out from the radiation image recording medium by causing a laser beam or a line beam to scan the radiation image recording medium. See, for instance, U.S. Pat. No. 4,535,468. By the use of the radiation image recording medium, the irradiation dose to the patient can be reduced and at the same time, the diagnostic performance can be improved.

We, this applicant, have proposed, in U.S. Pat. No. 6,268,614 and Japanese Unexamined Patent Publication No. 2000-16726, a radiation image recording medium which enables high response in reading and efficient takeout of the signal charge to be compatible with each other, a method of and an apparatus for recording a radiation image on the radiation image recording medium, and a method of and an apparatus for reading out a radiation image from the radiation image recording medium.

In the method of recording and reading out a radiation image disclosed in U.S. Pat. No. 6,268,614, a radiation image recording medium comprising a first electrode layer permeable to recording radiation or light generated by excitation by the recording radiation, a recording photoconductive layer which exhibits conductivity upon exposure to the recording radiation or the light generated by excitation by the recording radiation, a charge transfer layer which behaves like a substantially insulating material to a latent image charge and behaves like a substantially conductive material to a transfer charge in the polarity opposite to the latent image charge, a reading photoconductive layer which exhibits conductivity upon exposure to reading electromagnetic wave and a second electrode layer permeable to the reading light which are superposed one on another in this order is used, and the recording radiation is projected onto the first electrode layer of the radiation image recording medium so that electric charges are stored in a charge storing portion formed in an interface between the recording photoconductive layer and the charge transfer layer in an amount corresponding to the amount of the recording radiation projected onto the first electrode layer, whereby radiation image information is recorded on the radiation recording medium as an electrostatic latent image. Then the reading electromagnetic wave is projected onto the radiation image recording medium to read out the electrostatic latent image, whereby an image signal representing the radiation image information is obtained.

Further, we, this applicant, have proposed a radiation image recording medium in which the second electrode layer is in the form of a stripe electrode formed by a plurality of linear electrodes which are permeable to the reading electromagnetic wave and are arranged like stripes.

When radiation passing through an object is projected onto the first electrode layer of the radiation image recording medium with a DC voltage applied to the radiation image recording medium so that the first and second electrode layers respectively have negative and positive potentials, charged pairs are generated in the recording photoconductive layer in an amount corresponding to the amount of radiation passing through the first electrode layer, and negative charges are stored in the charge storing portion as latent image charges, whereby radiation image information is recorded on the radiation image recording medium as an electrostatic latent image.

When the reading electromagnetic wave is projected onto the second electrode layer of the radiation image recording medium after application of the DC voltage is stopped and the first and second electrode layers are short-circuited to relocate the charges, the reading electromagnetic wave passes through the second electrode layer and impinges upon the reading photoconductive layer to generate charged pairs in the reading photoconductive layer. The positive charges of the charged pairs passes through the charge transfer layer and combine with the negative charges stored in the charge storing portion whereas the negative charges recombine with the positive charge in the second electrode layer, whereby electrical discharges occur. By detecting change of voltage between the first and second electrode layers generated by the electrical discharges as electric current change by a current amplifier or the like, an image signal representing the radiation image information can be obtained.

An image is reproduced on the basis of the image signal on a display such as a monitor and used as a diagnostic image.

However, the radiation image recording medium is disadvantageous in that when a high voltage is applied between the first and second electrode layers, there is a fear that creeping discharges occur on the periphery of the first electrode layer to break the electrode, which can result in a defective reproduction image. There has been proposed in U.S. Pat. No. 6,495,817 to prevent breakage of the electrode due to creeping discharge by covering the entire area of a thick amorphous semiconductor film (corresponding to the recording photoconductive layer) with a highly resistive film. However, when a highly resistive film is provided in such a manner, an image area (an area actually exposed to the recording light) other than the periphery of the first electrode layer where creeping discharge can actually occur is also covered with the highly resistive film, which can cause chemical change in quality of the first electrode layer and/or the recording photoconductive layer and absorption of the recording light by the highly resistive film, thereby deteriorating the quality of the reproduction image.

SUMMARY OF THE INVENTION

In view of the foregoing observations and description, the primary object of the present invention is to provide an image recording medium which can prevent breakage of electrode which can occur in the first electrode layer due to creeping discharge or the like without deteriorating the quality of a reproduced image.

Another object of the present invention is to provide a method of producing such an image recording medium.

In accordance with a first aspect of the present invention, there is provided an image recording medium comprising a first electrode layer permeable to a recording electromagnetic wave carrying thereon image information, a recording photoconductive layer which generates electric charges according to the image information upon exposure to the recording electromagnetic wave and stores the electric charges and a second electrode layer for reading the electric charges stored in the recording photoconductive layer, which are superposed one on another in this order, wherein the improvement comprises that an anti-discharge member for preventing occurrence of an electric discharge on the periphery of the first electrode layer is provided only on the periphery of the first electrode layer.

The "recording electromagnetic wave" as used here may be, for instance, radiation but should be broadly interpreted to include, for instance, fluorescence emitted from a phosphor upon exposure to radiation carrying thereon radiation image information.

The "periphery of the first electrode layer" as used here means the side surface of the first electrode layer plus the area of the outer surface of the first electrode layer within a predetermined length from the side surface toward the center of the first electrode layer. It is preferred that the "periphery of the first electrode layer" be an area where change in quality of the first electrode layer due to the anti-discharge member and absorption of the recording light by the anti-discharge member do not involve a serious problem. For example, the periphery of the first electrode layer is preferably the side surface of the first electrode layer plus the area of the outer surface of the first electrode layer within 1 to 20 mm from the side surface toward the center of the first electrode layer and more preferably the side surface of the first electrode layer plus the area of the outer surface of the first electrode layer within 4 to 5 mm from the side surface toward the center of the first electrode layer.

An anti-discharge member (for preventing occurrence of an electric discharge) may be provided on the surface of the image recording medium other than the side surface and the outer surface of the first electrode layer, if necessary.

The anti-discharge member may be formed by curing an adhesive.

The adhesive may be any adhesive so long as it forms a dielectric body when cured. For example, Araldite® may be employed.

Further, an anti-discharge tape comprising an adhesive layer and a dielectric film may be employed as the anti-discharge member.

In accordance with a second aspect of the present invention, there is provided a method of producing an image recording medium comprising a first electrode layer permeable to a recording electromagnetic wave carrying thereon image information, a recording photoconductive layer which generates electric charges according to the image information upon exposure to the recording electromagnetic wave and stores the electric charges and a second electrode layer for reading the electric charges stored in the recording photoconductive layer, which are superposed one on another in this order, wherein the improvement comprises the step of forming an anti-discharge member for preventing occurrence of an electric discharge on the periphery of the first electrode layer only on the periphery of the first electrode layer.

In accordance with the present invention, breakage of electrode which can occur in the first electrode layer due to creeping discharge or the like can be prevented without deteriorating the quality of a reproduced image due to change of the first electrode layer caused by contact with the anti-discharge member and/or absorption of the recording electromagnetic wave.

Since adhesive is easily available, the anti-discharge member can be simply formed when the anti-discharge member is formed by curing an adhesive.

When an anti-discharge tape is employed as the anti-discharge member, the anti-discharge member can be more easily handled.

DESCRIPTION OF THE PREFERRED EMBODIMENTS

Figure 1A:
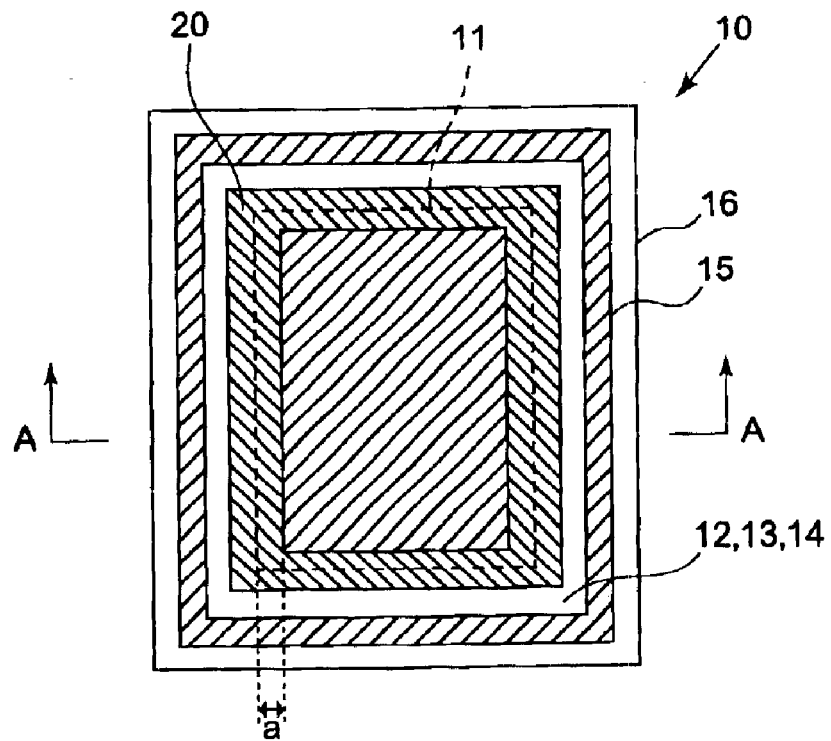
FIG. 1A is a plan view showing a image recording medium in accordance with a first embodiment of the present invention.
Figure 1B:
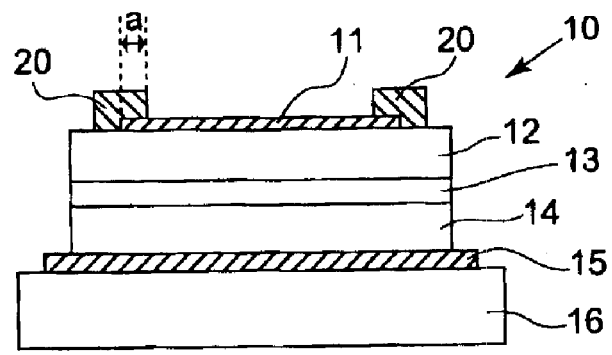
FIG. 1B is a cross-section view taken along line A—A in FIG. 1A.

In FIGS. 1A and 1B, a radiation image recording medium 10 in accordance with a first embodiment of the present invention comprises a first electrode layer 11 permeable to recording radiation (e.g., X-rays), a recording photoconductive layer 12 which exhibits conductivity upon exposure to the recording radiation passing through the first electrode layer 11, a charge transfer layer 13 which behaves like a substantially insulating material to a latent image charge (e.g., a negative charge) and behaves like a substantially conductive material to a transfer charge in the polarity opposite to the latent image charge, a reading photoconductive layer 14 which exhibits conductivity upon exposure to a reading electromagnetic wave (will be referred to as "reading light", hereinbelow) and a second electrode layer 15 permeable to the reading light which are superposed one on another in this order from the second electrode layer 15 on a glass substrate 16 permeable to the reading light.

A high electric voltage (e.g., 20V/$\mu$m) is applied to the radiation image recording medium 10 between the first and second electrode layers 11 and 15 when a radiation image is recorded thereon. At this time, creeping discharge can occur on the periphery of the first electrode layer 11 to break the first electrode layer 11. As shown in FIGS. 1A and 1B, an anti-discharge member 20 for preventing creeping discharge on the periphery of the first electrode layer 11 is provided on the periphery of the first electrode layer 11.

The anti-discharge member 20 may be formed, for instance, by curing adhesive such as Araldite®. It is preferred that the anti-discharge member 20 be formed over the side surface of the first electrode layer 11 plus the area of the outer (or upper) surface of the first electrode layer 11 within 1 to 20 mm from the side surface toward the center of the first electrode layer 11 (1 mm$\leq$a$\leq$20 mm). More preferably, the anti-discharge member 20 is formed over the side surface of the first electrode layer 11 plus the area of the outer (or upper) surface of the first electrode layer 11 within 4 to 5 mm from the side surface toward the center of the first electrode layer 11 (4 mm$\leq$a$\leq$5 mm).

Why the anti-discharge member 20 is provided not over the entire area of the first electrode layer 11 but only on the periphery of the first electrode layer 11 is that creeping discharge actually occurs only on the periphery and if the anti-discharge member 20 is provided over the entire area of the first electrode layer 11, there arises a fear that chemical change in quality of the first electrode layer 11 can occur due to contact between the anti-discharge 20 and the first electrode layer 11 and absorption of the recording light by the anti-discharge member 20 can occur in an image area (an area actually exposed to the recording light) other than the periphery of the first electrode layer 11.

On the area other than the side surface and the outer surface of the first electrode layer 11, an anti-discharge member (for preventing occurrence of an electric discharge) may be provided on the surface of the image recording medium 11, if necessary.

The anti-discharge member 20 may be formed of an anti-discharge tape comprising a dielectric film (e.g., fluorine plastic tape) and an adhesive layer.

When the anti-discharge member 20 is formed of an adhesive, solvent contained in the adhesive can chemically change the quality of the first electrode layer 11 and/or the recording photoconductive layer 12, whereas the anti-discharge tape contains no or too small amount of solvent to chemically change the quality of the first electrode layer 11 and/or the recording photoconductive layer 12.

Figure 2A:
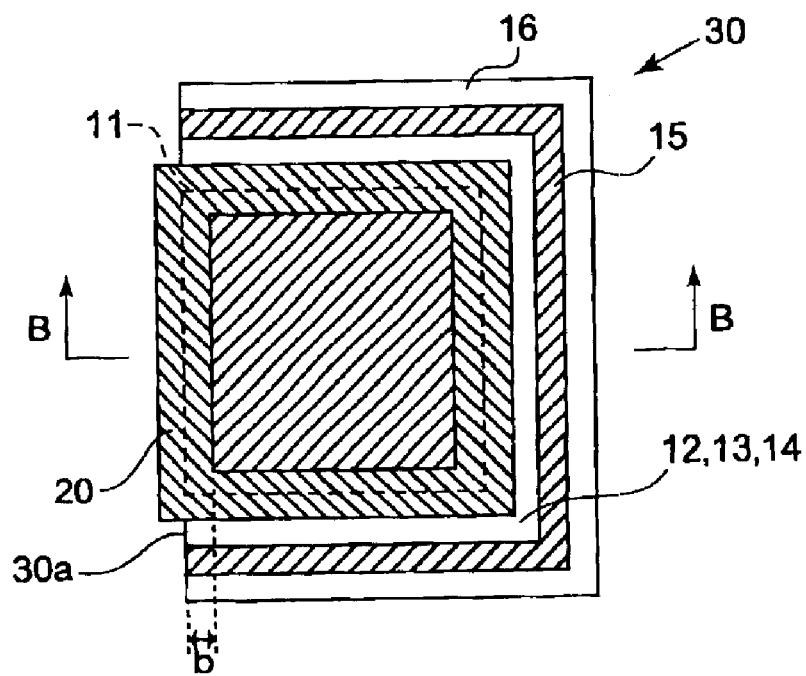
FIG. 2A is a plan view showing a image recording medium in accordance with a second embodiment of the present invention.
Figure 2B:
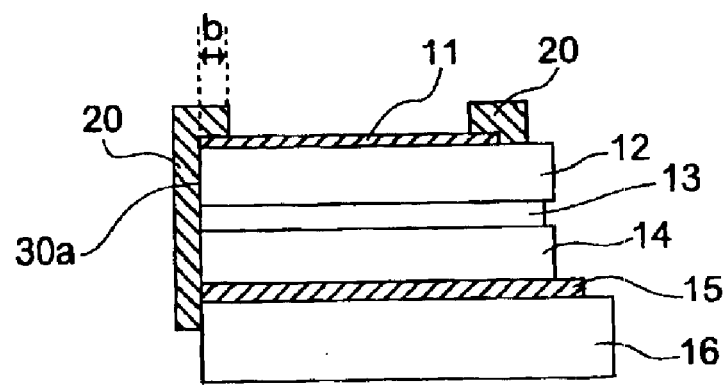
FIG. 2B is a cross-section view taken along line B—B in FIG. 2A.

When recording a radiation image of a chest (e.g., a heart and a lung), an image recording medium 10 shown in FIGS. 1A and 1B is used. Whereas, when recording a radiation image of a mamma, an image recording medium 30 where a radiation image is recorded up to an edge 30a as shown in FIGS. 2A and 2B is used. FIGS. 2A and 2B show an image recording medium 30 for recording a radiation image of a mamma in accordance with a second embodiment of the present invention.

In the image recording medium 30 for recording a radiation image of a mamma, the edges of the first electrode layer 11, the recording photoconductive layer 12, the charge transfer layer 13, the reading photoconductive layer 14 and the second electrode layer 15 forming the edge 30a of the image recording medium 30 up to which an image is recorded are arranged to be in flush with each other. Accordingly, creeping discharge is apt to occur in the edge 30a.

In this case, it is preferred that the anti-discharge member 20 be formed to cover a part of the edge 30a in addition to the side surface of the first electrode layer 11 plus the area of the outer (or upper) surface of the first electrode layer 11 within 1 to 20 mm from the side surface toward the center of the first electrode layer 11 (more preferably, the side surface of the first electrode layer 11 plus the area of the outer (or upper) surface of the first electrode layer 11 within 4 to 5 mm from the side surface toward the center of the first electrode layer 11).

When a scratch is formed in the first electrode layer 11 during production of the image recording medium, there arises a fear that the first electrode layer can be broken due to the scratch. In order to prevent this, an anti-discharge member may be provided on the scratched area.

What is claimed is:

1. An image recording medium comprising a first electrode layer permeable to a recording electromagnetic wave carrying thereon image information, a recording photoconductive layer which generates electric charges according to the image information upon exposure to the recording electromagnetic wave and stores the electric charges and a second electrode layer for reading the electric charges stored in the recording photoconductive layer, which are superposed one on another in this order, wherein the improvement comprises that an anti-discharge member for preventing occurrence of an electric discharge on the periphery of the first electrode layer is provided only on the periphery of the first electrode layer.

2. An image recording medium as defined in claim 1 in which the periphery of the first electrode layer is the side surface of the first electrode layer plus the area of the outer surface of the first electrode layer within 1 to 20 mm from the side surface toward the center of the first electrode layer.

3. An image recording medium as defined in claim 2 in which the anti-discharge member is formed by curing an adhesive.

4. An image recording medium as defined in claim 2 in which the anti-discharge member is formed by an anti-discharge tape comprising an adhesive layer and a dielectric film.

5. An image recording medium as defined in claim 1 in which the anti-discharge member is formed by curing an adhesive.

6. An image recording medium as defined in claim 1 in which the anti-discharge member is formed by an anti-discharge tape comprising an adhesive layer and a dielectric film.

7. A method of producing an image recording medium comprising a first electrode layer permeable to a recording electromagnetic wave carrying thereon image information, a recording photoconductive layer which generates electric charges according to the image information upon exposure to the recording electromagnetic wave and stores the electric charges and a second electrode layer for reading the electric charges stored in the recording photoconductive layer, which are superposed one on another in this order, wherein the improvement comprises the step of forming an anti-discharge member for preventing occurrence of an electric discharge on the periphery of the first electrode layer only on the periphery of the first electrode layer.

* * * * *